(12) United States Patent
Ivanov et al.

(10) Patent No.: US 7,868,403 B1
(45) Date of Patent: Jan. 11, 2011

(54) INTEGRATED MEMS RESONATOR DEVICE

(75) Inventors: Tony Ivanov, Summerfield, NC (US);
Julio Costa, Summerfield, NC (US);
Jonathan Hale Hammond, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 472 days.

(21) Appl. No.: 11/680,849

(22) Filed: Mar. 1, 2007

(51) Int. Cl.
*H01L 27/14* (2006.01)
(52) U.S. Cl. .................. 257/417; 438/50; 257/E27.112
(58) Field of Classification Search ................. 257/417, 257/E27.112; 438/50
See application file for complete search history.

(56) References Cited

U.S. PATENT DOCUMENTS

| | | | | |
|---|---|---|---|---|
| 6,531,331 | B1* | 3/2003 | Bennett et al. | 438/48 |
| 6,876,056 | B2* | 4/2005 | Tilmans et al. | 257/528 |
| 6,960,488 | B2* | 11/2005 | Brosnihan et al. | 438/52 |
| 2003/0042561 | A1* | 3/2003 | Funaki | 257/415 |
| 2004/0245586 | A1* | 12/2004 | Partridge et al. | 257/414 |

* cited by examiner

*Primary Examiner*—Steven J Fulk
(74) *Attorney, Agent, or Firm*—Withrow & Terranova, P.L.L.C.

(57) ABSTRACT

The present invention provides a method for manufacturing a micro-electro-mechanical system (MEMS) resonator device using the same device layer, dielectric layer, and conductive layer that is used to create other electrical devices in a complementary metal oxide semiconductor (CMOS) process.

5 Claims, 13 Drawing Sheets

INTEGRATED MEMS RESONATOR DEVICE

FIELD OF THE INVENTION

The present invention relates to a micro-electro-mechanical systems (MEMS) resonator device, and more particularly to a MEMS resonator device integrated into a standard complementary metal oxide semiconductor (CMOS) process.

BACKGROUND OF THE INVENTION

A MEMS device includes at least one mechanical element, such as a sensor, actuator, or resonator that is formed using a micromachining process that selectively etches away parts of a wafer. The wafer may include added structural layers and may be made of a semiconductor material, such as silicon. By using a semiconductor wafer, standard foundry integrated circuit (IC) processing, such as complementary metal-oxide-semiconductor (CMOS), bipolar, and bipolar CMOS (BIC-MOS) may be used to add electronic components, which form an IC, to create a combined MEMS device and IC on a single wafer, which includes both mechanical elements and electronic components. However, MEMS devices may be formed before or after standard foundry IC processing using high temperature oxidation, deposition, or both. Such pre-processing and post-processing steps add complexity and cost. Further, some MEMS devices, such as resonators, may require very fine gaps, which are difficult to fabricate.

Incorporating a MEMS device and an IC on a single wafer using standard foundry IC processing techniques eliminates the need for very fine gaps, therefore simplifying the manufacturing process as well as minimizing the overall footprint of the semiconductor device. However, a common challenge remaining in creating a MEMS resonator device is the inability to construct transducers that will efficiently and effectively convert electrical signals to mechanical vibrations and vice versa. The transducers are effectively capacitors created by forming a dielectric plate between a transducer plate and the body of the MEMS device. To increase the effectiveness of the transducers, there is a need to increase capacitance by minimizing the distance between the transducer plate and the body as well as provide a dielectric plate with a relatively high dielectric constant without significantly increasing the cost or complexity of the manufacturing process.

Accordingly, there is a need for a process to create a MEMS device using a standard CMOS process. There is a further need to increase the efficiency of the transducers of the MEMS device using such a process.

SUMMARY OF THE INVENTION

The present invention provides a method for manufacturing a micro-electro-mechanical system (MEMS) resonator device using the same device layer, dielectric layer, and conductive layer that is used to create other electrical devices in a complementary metal oxide semiconductor (CMOS) process. The manufacturing process of one embodiment begins by providing a substrate having a first dielectric layer on a surface of a wafer, and a device layer on the first dielectric layer. A field effect transistor (FET) is formed on the device layer, and a substantially freely suspended MEMS resonator body is created from the device layer. The FET includes a gate formed from a gate dielectric and a gate electrode. The MEMS resonator device includes an input transducer and an output transducer on the MEMS resonator body. Each transducer is effectively a capacitor created by forming a dielectric plate between a transducer plate and the resonator body. The dielectric plate is formed from the dielectric layer, which is also used to form the gate dielectric for the gate. The transducer plate is formed from the conductive layer, which is also used to form the gate electrode for the gate.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 1-13B depict the process of manufacturing an integrated MEMS resonator device in a typical complementary metal oxide semiconductor (CMOS) process.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a method for manufacturing a micro-electro-mechanical system (MEMS) resonator device using the same device layer, dielectric layer, and conductive layer that is used to create other electrical devices in a complementary metal oxide semiconductor (CMOS) process.

The manufacturing process of one embodiment begins by providing a substrate having a first dielectric layer on a surface of a wafer, and a device layer on the first dielectric layer. A field effect transistor (FET) is formed on the device layer, and a substantially freely suspended MEMS resonator body is created from the device layer. The FET includes a gate formed from a gate dielectric and a gate electrode. The MEMS resonator device includes an input transducer and an output transducer on the MEMS resonator body. Each transducer is effectively a capacitor created by forming a dielectric plate between a transducer plate and the resonator body. The dielectric plate is formed from the dielectric layer, which is also used to form the gate dielectric for the gate. The transducer plate is formed from the conductive layer, which is also used to form the gate electrode for the gate.

The dielectric layer provides a thin, reliable, and controlled dielectric with a high dielectric constant for the dielectric plate of the transducers. The conductive layer provides low resistive losses, high-quality dimension control, and a high Q for the transducer plate of the transducers.

In the following example, a MEMS resonator device is created using the same device layer, dielectric layer, conductive layer, and first metal layer used to form the gate of a FET. With reference to the graphical representations of FIGS.

Figure 1:
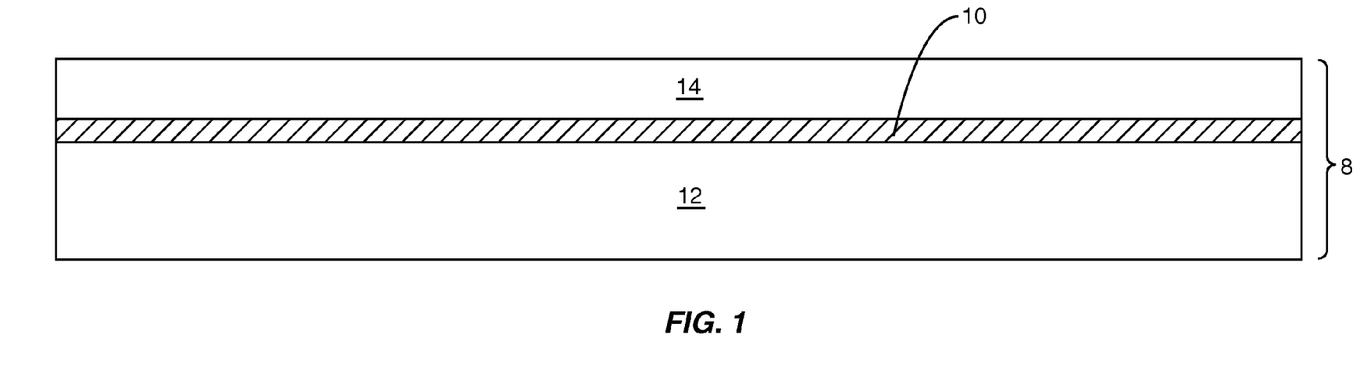

1-13B, a manufacturing process for creating the MEMS resonator device as part of the existing CMOS process is provided according to one embodiment of the present invention. In FIG. 1, the manufacturing process begins by providing a substrate 8 having a first dielectric layer 10 on a surface of a wafer 12 and a device layer 14 formed on the first dielectric layer 10. The wafer 12 may provide mechanical support and rigidity for the substrate 8, and includes a semiconductor material, such as silicon. The first dielectric layer 10 may be buried oxide (BOX) or the like, and may electrically insulate the device layer 14 from the wafer 12. The device layer 14, which may be made of silicon or the like, provides a surface on which to build active devices, such as FETs, transducers, resistors, capacitors, or the like.

Figure 2:
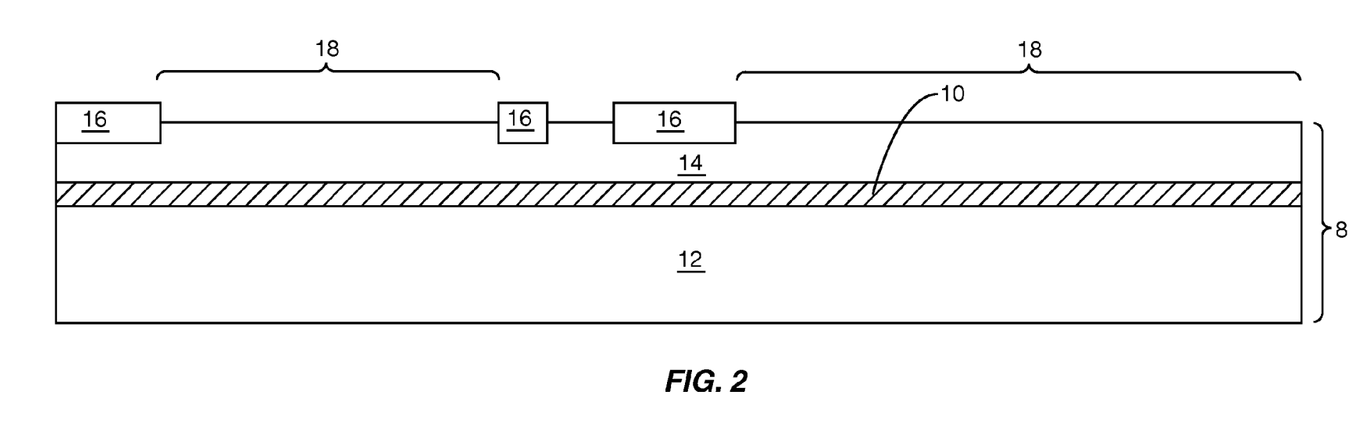

In FIG. 2, trenches are etched into the device layer 14 and filled with a material, such as thermal oxide or the like, to provide field isolation regions 16. The field isolation regions 16 are created to provide separation between active device areas 18 on the surface of the device layer 14.

Figure 3:
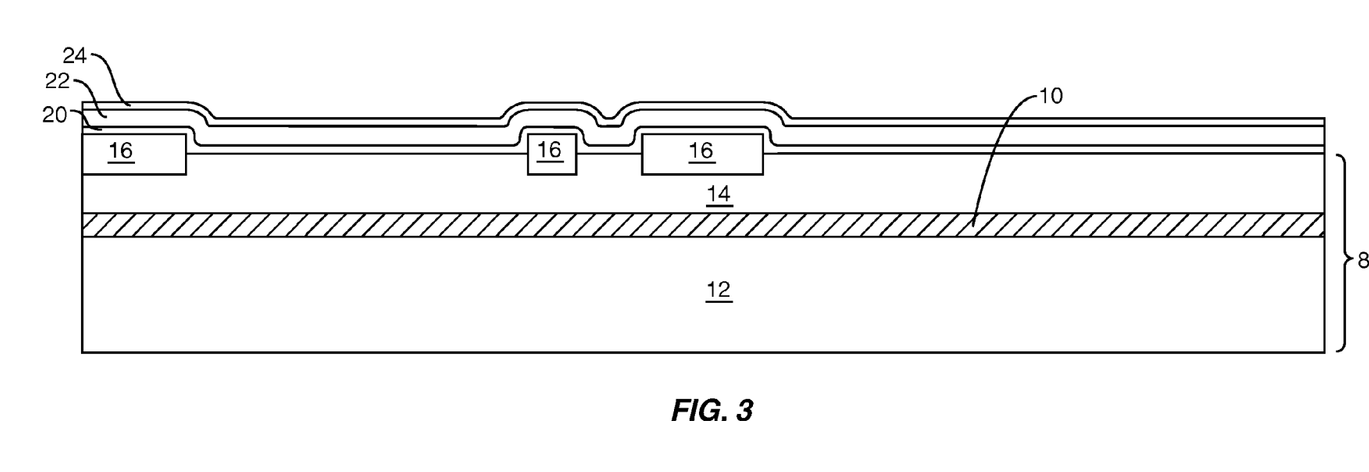

In FIG. 3, a second dielectric layer 20 is deposited on the device layer 14. Next, a conductive layer 22 is deposited over the second dielectric layer 20. A first metal layer 24 is then deposited over the conductive layer 22. The second dielectric layer 20 may be silicon oxide (SiO2), hafnium oxide (HfO2), or the like and may be approximately 0.002 to 0.015 µm in thickness. In a preferred embodiment, the second dielectric layer may be approximately 0.012 µm in thickness. The conductive layer 22 may be a salicide, silicide, poly silicon, metal, or the like and may be approximately 0.1 to 0.5 µm in thickness. In a preferred embodiment, the conductive layer may be approximately 0.3 µm in thickness. The first metal layer 24 may be titanium (Ti), tungsten (W), or the like and may be approximately 0.01 to 0.3 µm in thickness. In a preferred embodiment, the first metal layer may be approximately 0.1 µm in thickness. Those skilled in the art will recognize other thicknesses for the second dielectric layer 20, the conductive layer 22, and the first metal layer 24 are applicable. Although various layers are depicted on top of one another in this example, those skilled in the art will recognize that there may be any number of layers in between the depicted layers without departing from the functionality or concept of the present invention.

Figure 4:
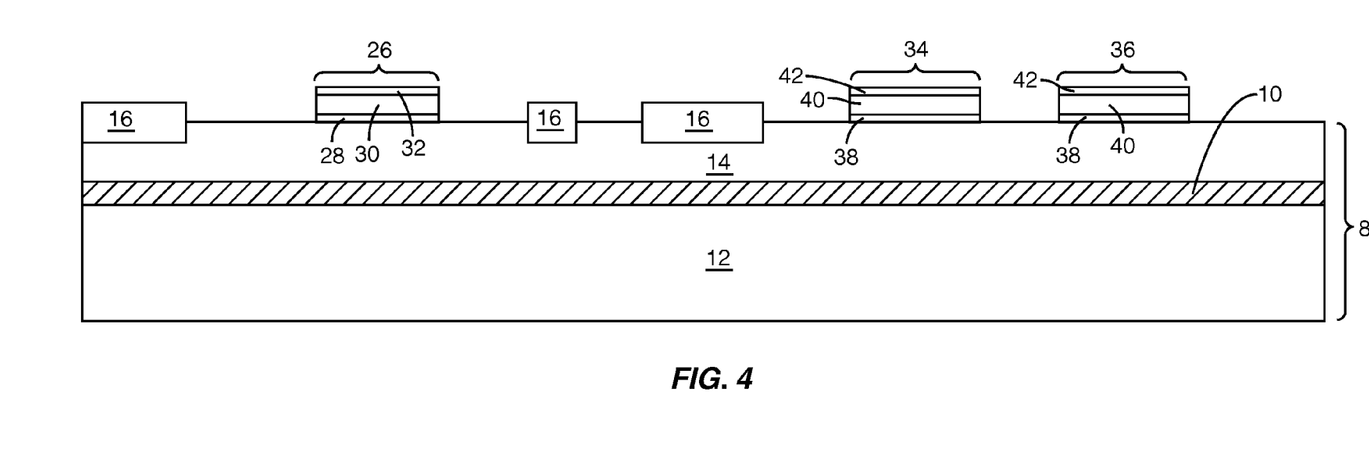

In FIG. 4, the second dielectric layer 20, the conductive layer 22, and the first metal layer 24 are etched to form the gate 26 for the FET. The gate 26 includes a gate dielectric 28 formed from the second dielectric layer 20, a gate electrode 30 formed from the conductive layer 22, and a gate contact 32 formed from the first metal layer 24. Notably, the etching process also forms the input transducer 34 and the output transducer 36 for the MEMS resonator device. The input transducer 34 and the output transducer 36 are each essentially capacitors created by forming a dielectric plate 38 between a transducer plate 40 and a subsequently formed MEMS resonator body within the device layer 14. A metal contact plate 42 is formed on the transducer plate 40 of each transducer to facilitate an electrical connection to other components.

The dielectric plate 38 is formed from the second dielectric layer 20, which is also used to form the gate dielectric 28 for the gate 26. The transducer plate 40 is formed from the conductive layer 22, which is also used to form the gate electrode 30 for the gate 26. The metal contact plate 42 is formed from the first metal layer 24, which is also used to form the gate contact 32. The second dielectric layer 20 provides a thin, reliable, and controlled dielectric with a high dielectric constant for the dielectric plate 38 of the input transducer 34 and output transducer 36. The conductive layer 22 provides minimum resistive losses, high-quality dimension control, and a high charge for the transducer plate 40 of the input transducer 34 and the output transducer 36.

Figure 5:
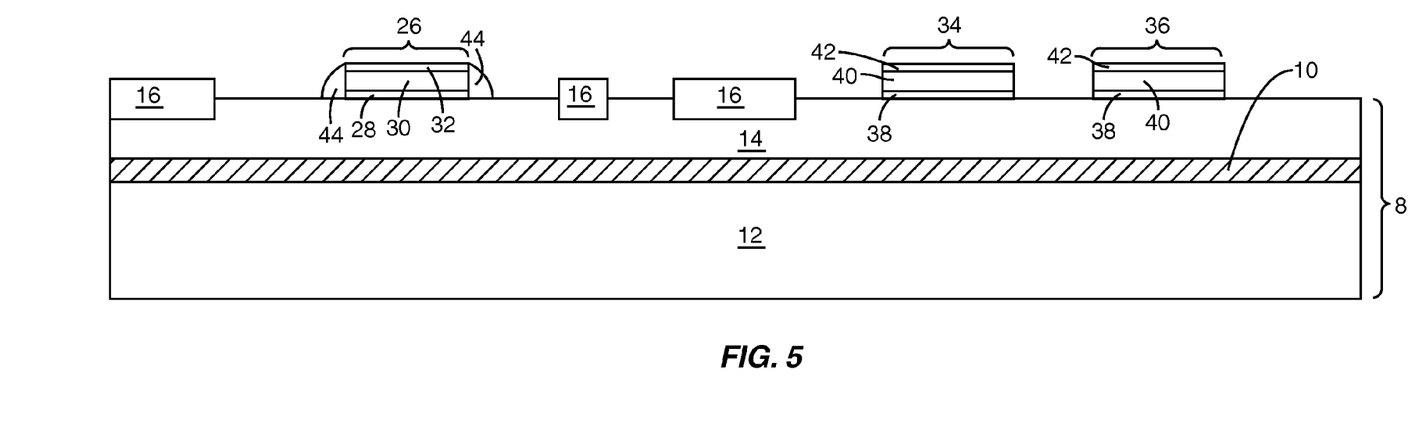
Figure 6:
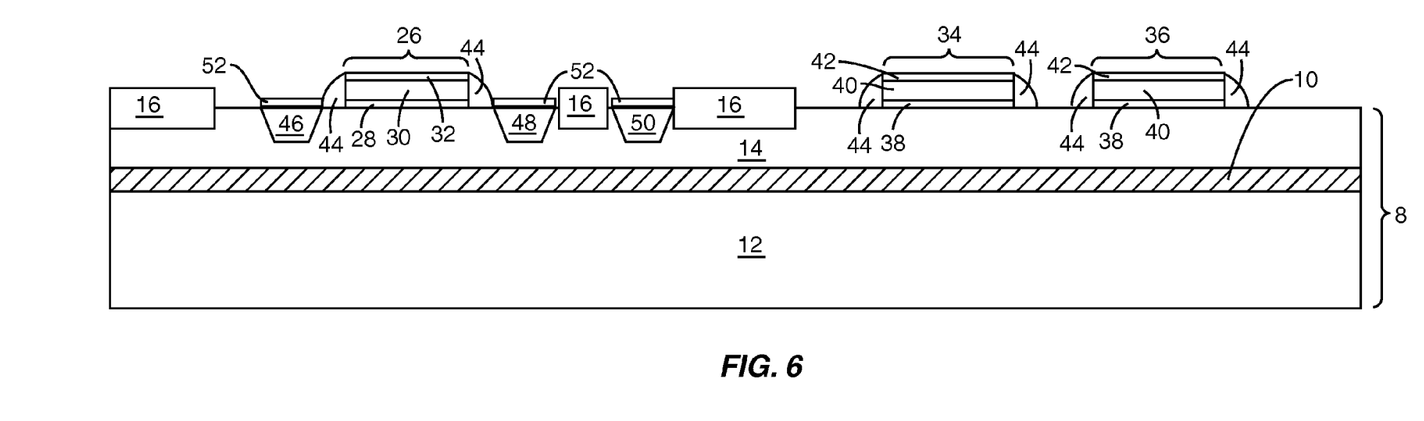

In FIG. 5, a gate spacer 44 is formed about the gate 26, the input transducer 34, and the output transducer 36 from silicon oxide (SiO2), silicon nitride (Si3N4), or like material. In FIG. 6, the source region 46 and the drain region 48 of the FET are formed within the device layer 14 by implanting N (or P) type material in the device layer 14 on both sides of the gate 26. Also, a body region 50 is formed by implanting P (or N) type material in the device layer 14 to the right of the drain region 48. The body region 50 is isolated from the drain region 48 by a field isolation region 16. A contact layer 52 is deposited on the surface of the device layer 14 over the source region 46, the drain region 48, and the body region 50.

Figure 7A:
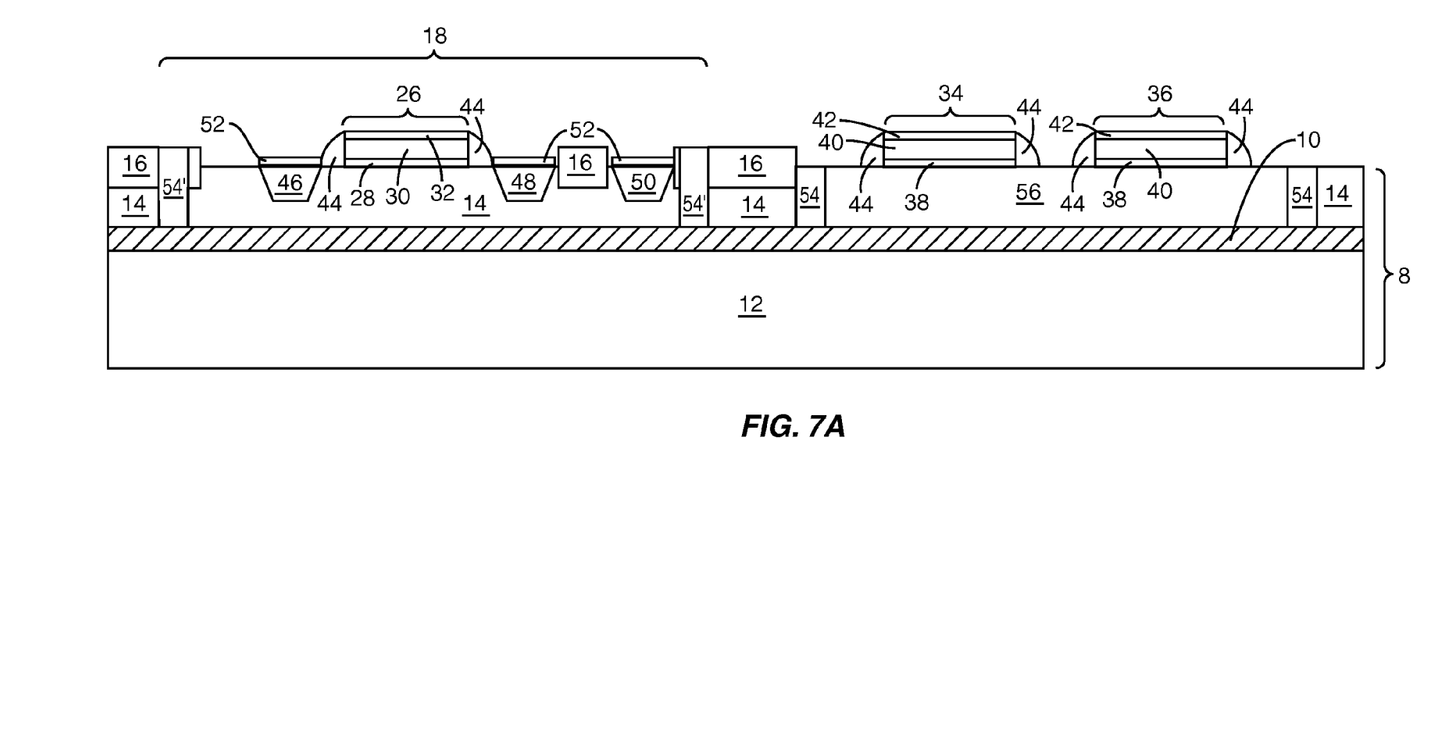
Figure 7B:
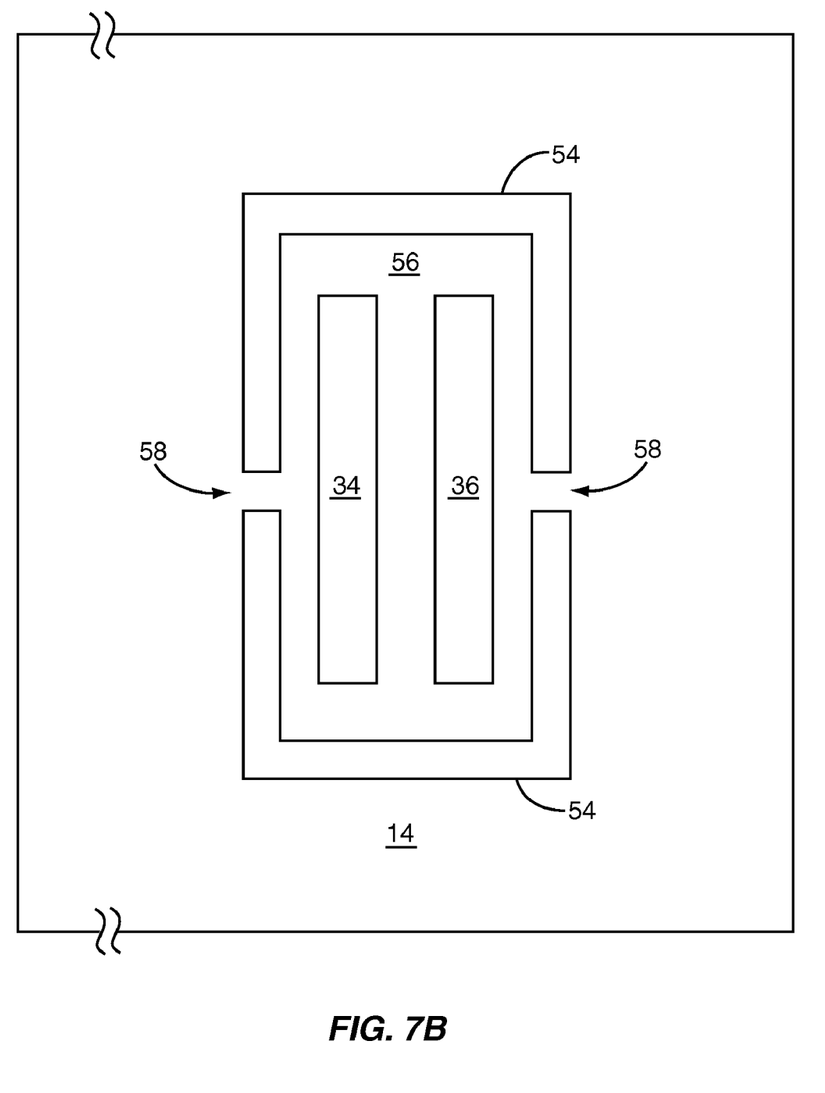

In FIGS. 7A and 7B, a trench 54 is etched through the device layer 14 to the first dielectric layer 10 and substantially around a region defining a MEMS resonator body 56. As shown in FIG. 7B, the trench 54 is etched such that one or more portions of the device layer 14 remain in place to form anchors 58, which connect the MEMS resonator body 56 to the device layer 14. A trench 54' may also be etched around a region containing the FET as illustrated in FIG. 7A.

Figure 8A:
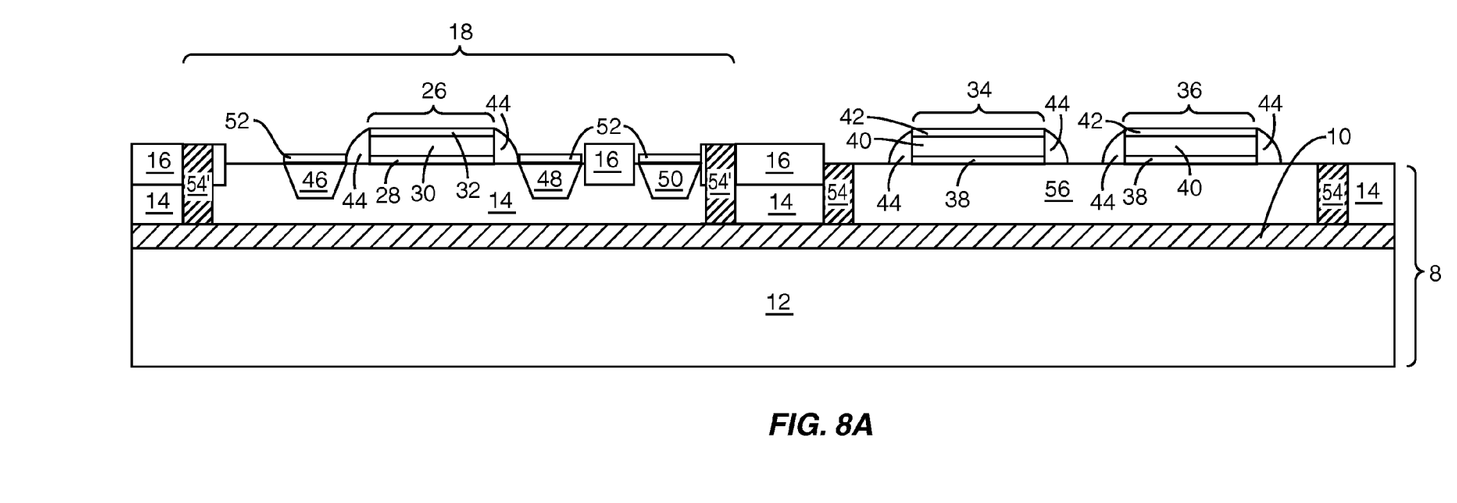
Figure 8B:
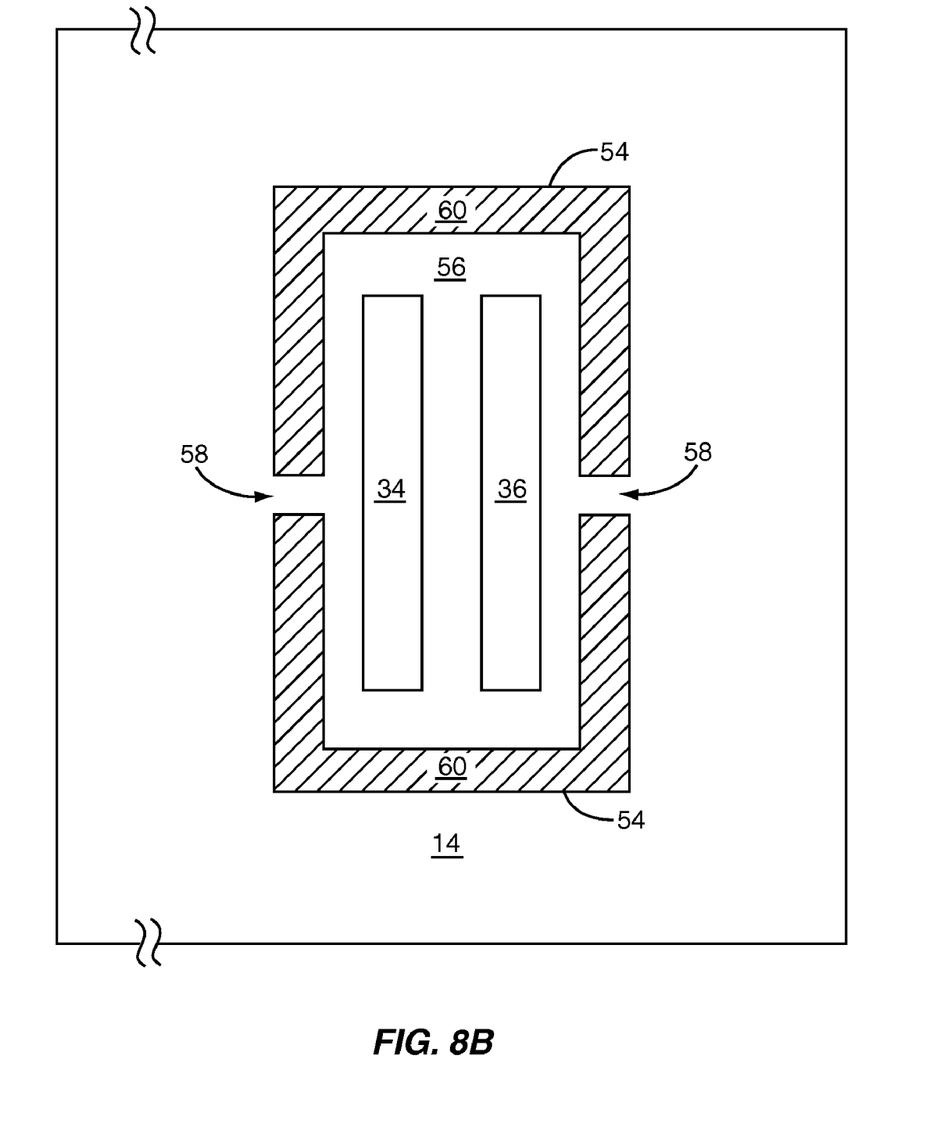

In FIGS. 8A and 8B, an oxide 60 or the like is formed in the trenches 54 and 54'. Once filled with the oxide 60, the trench 54' forms an oxide barrier, which surrounds the active device area 18 that contains the FET. The oxide barrier surrounding the active device area 18 will remain intact.

For the MEMS device, the oxide 60 provided in the trench 54 will be etched away, along with the portion of the first dielectric layer 10 that is under the MEMS resonator body 56, to substantially release the MEMS resonator body 56 from the substrate 8. As illustrated in FIG. 8B, the anchors 58 connect the suspended MEMS resonator body 56 to the device layer 14.

Figure 9:
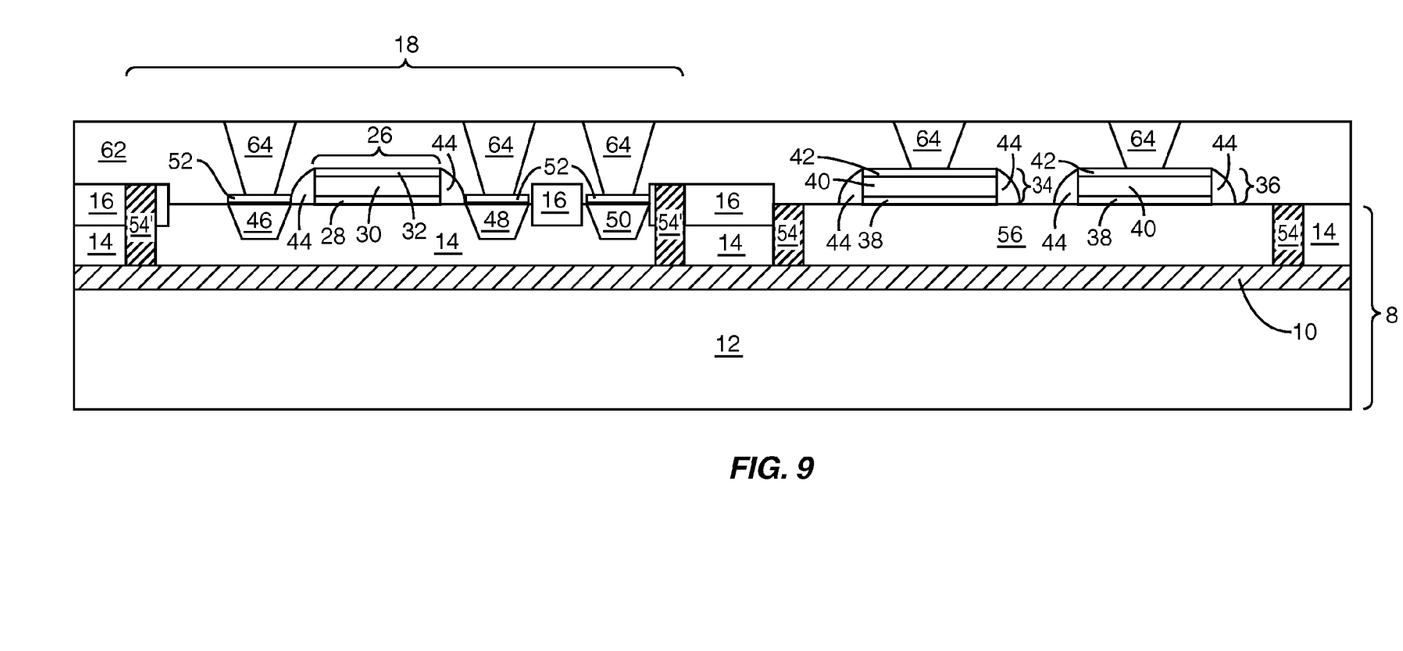

In FIG. 9, a third dielectric layer 62, which may be silicon oxide (SiO2), low permittivity dielectric, or the like, is formed over the device layer 14 and any device thereon including the MEMS resonator body 56. Holes are etched through the third dielectric layer 62 over the source region 46, the drain region 48, the body region 50, the input transducer 34, and the output transducer 36 to form contact vias 64. These contact vias 64 are filled with metal or other conductive material to provide an electrical connection to the respective devices and regions.

Figure 10:
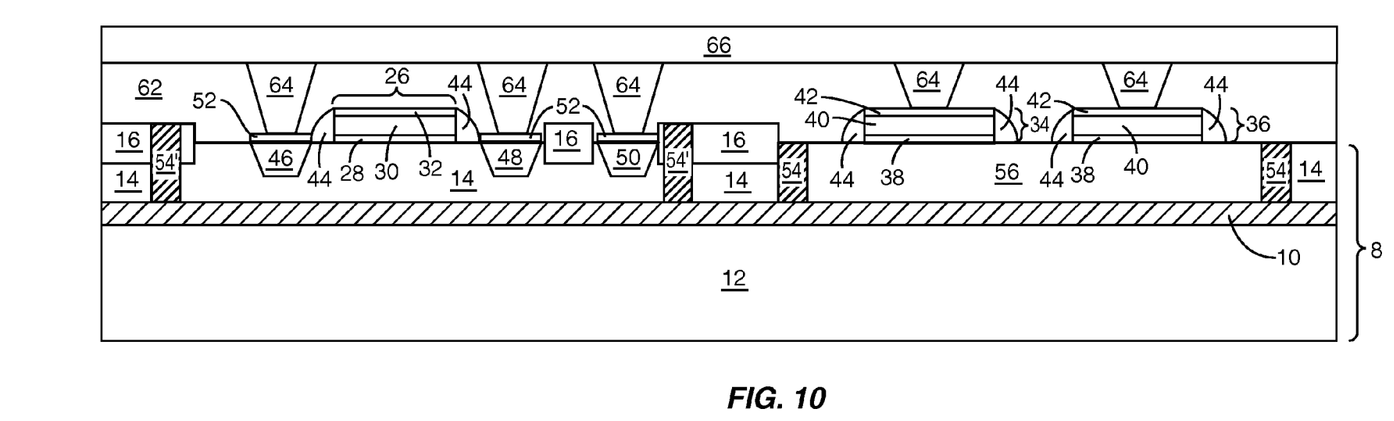
Figure 11:
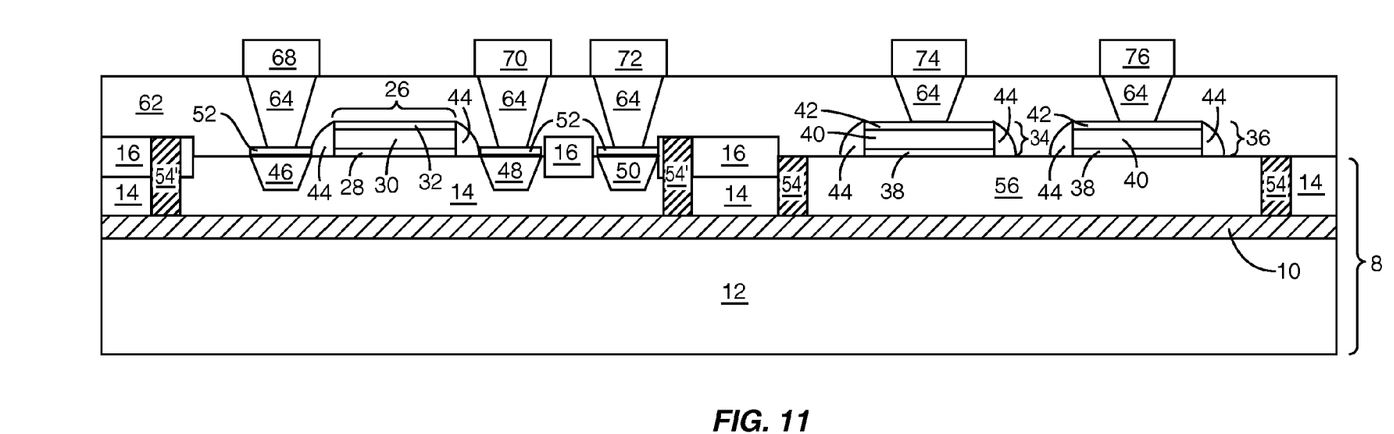

In FIG. 10, a second metal layer 66, which may be aluminum (Al), copper (Cu), or the like, is created over the third dielectric layer 62. In FIG. 11, the second metal layer 66 is etched to form a source contact 68 over the source region 46, a drain contact 70 over the drain region 48, and a body contact 72 over the body region 50 for the FET; and is etched to form an input contact 74 over the input transducer 34, and an output contact 76 over the output transducer 36. The respective vias and contacts are electrically coupled to provide electrical connections to the corresponding devices and regions.

Figure 12:
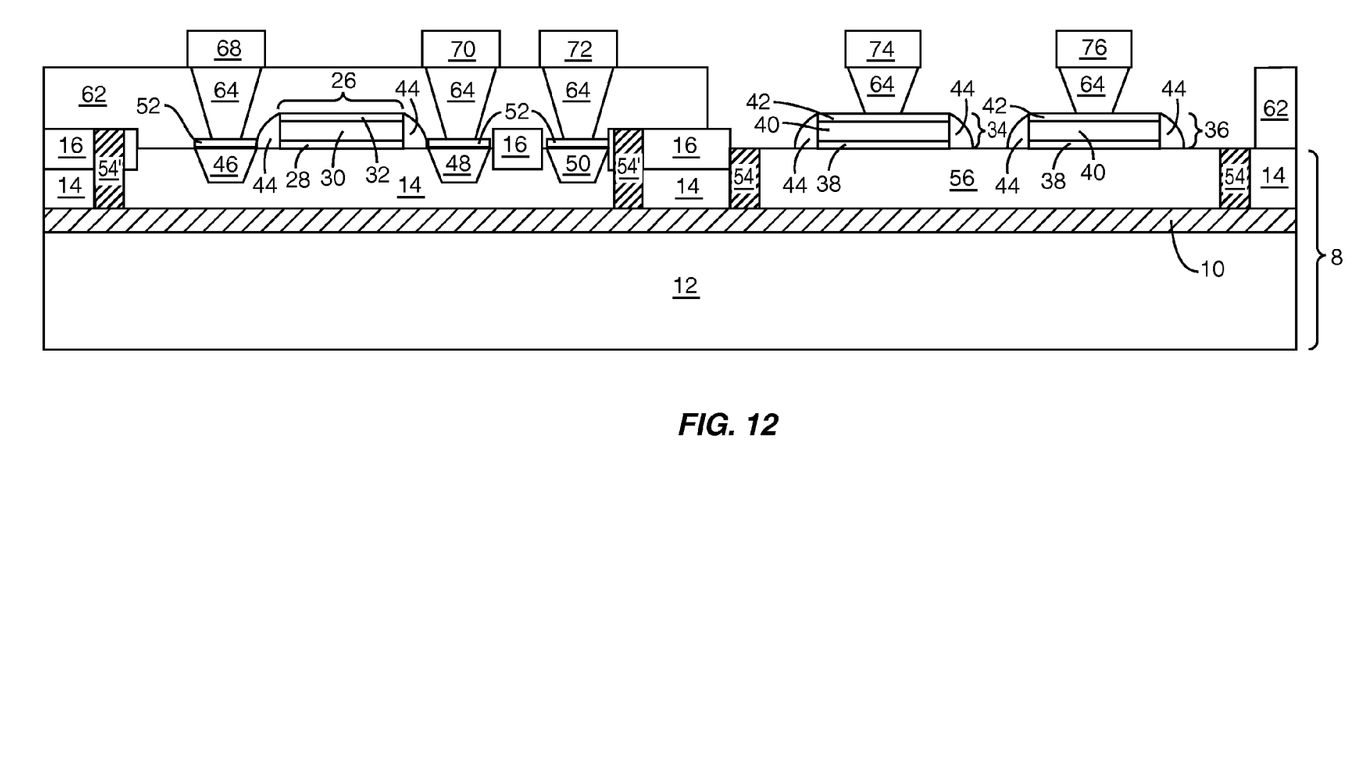
Figure 13A:
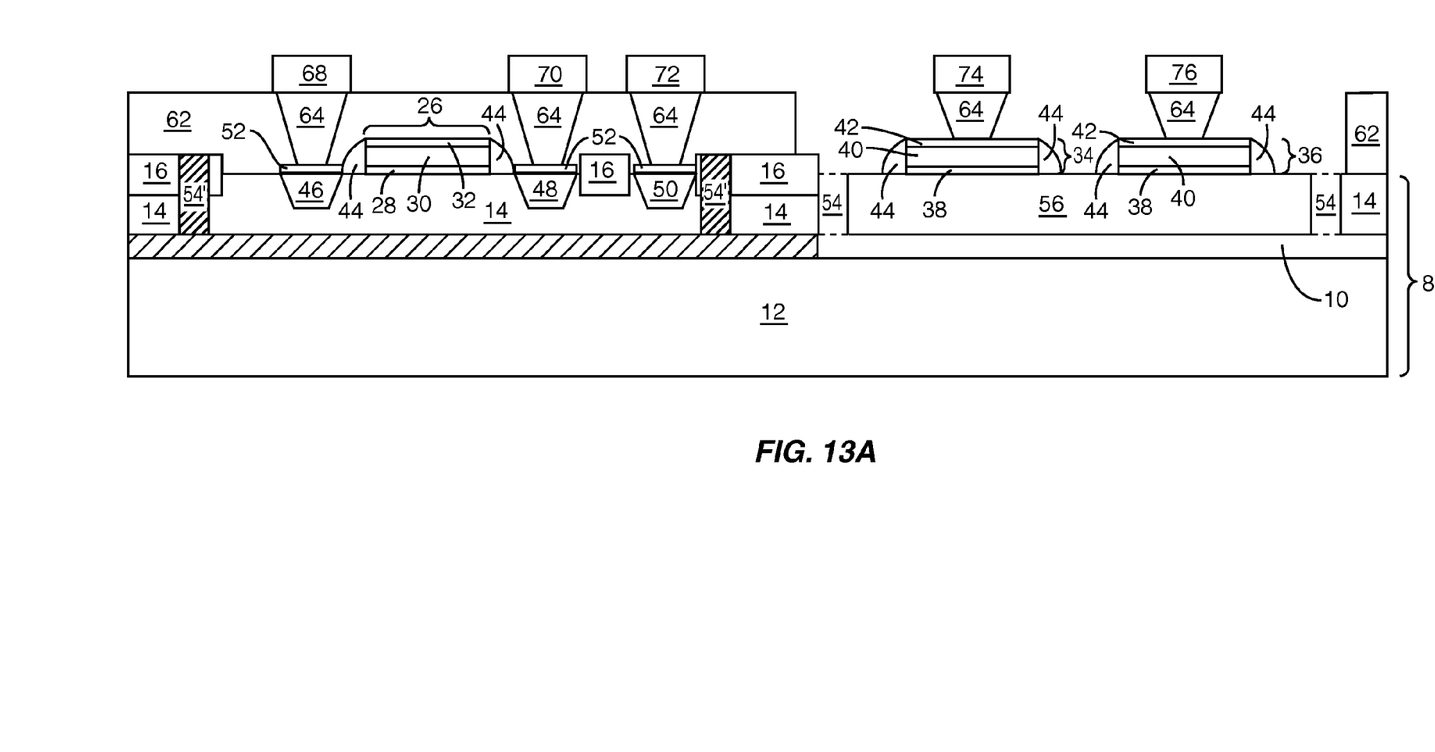
Figure 13B:
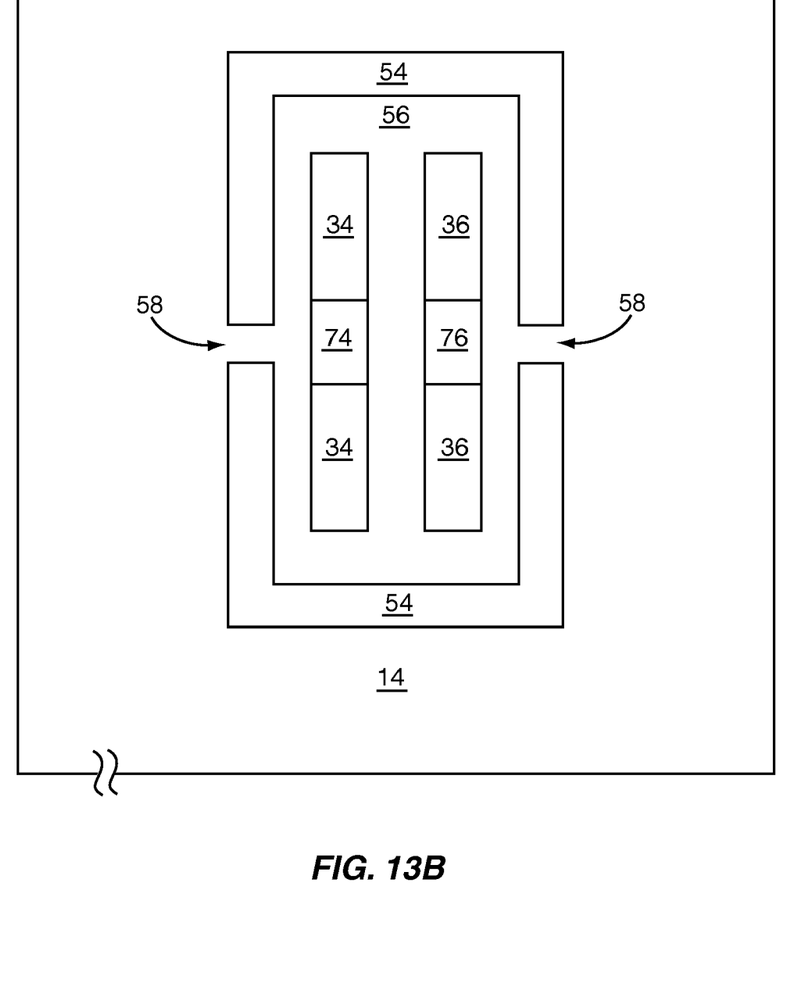

In FIG. 12, a portion of the third dielectric layer 62, over the MEMS resonator body 56 is etched away. In FIGS. 13A and 13B, the oxide 60 provided in the trench 54, along with the portion of the first dielectric layer 10 that is under the MEMS resonator body 56, is etched away to substantially release the MEMS resonator body 56 from the substrate 8. The anchors 58 connect the suspended MEMS resonator body 56 to the device layer 14 as shown in FIG. 13B. Although two anchors 58 are illustrated, any number of anchors 58 may be employed. FIG. 13B shows the input contact 74 over the input transducer 34, as well as the output contact 76 over the output transducer 36. The input transducer 34 and output transducer 36 are over the MEMS resonator body 56, which is connected to the device layer 14 by the anchor 58 on both sides of the MEMS resonator body 56. As such, the MEMS resonator body 56 is substantially freely suspended to allow mechanical vibration during operation.

Figure 14:
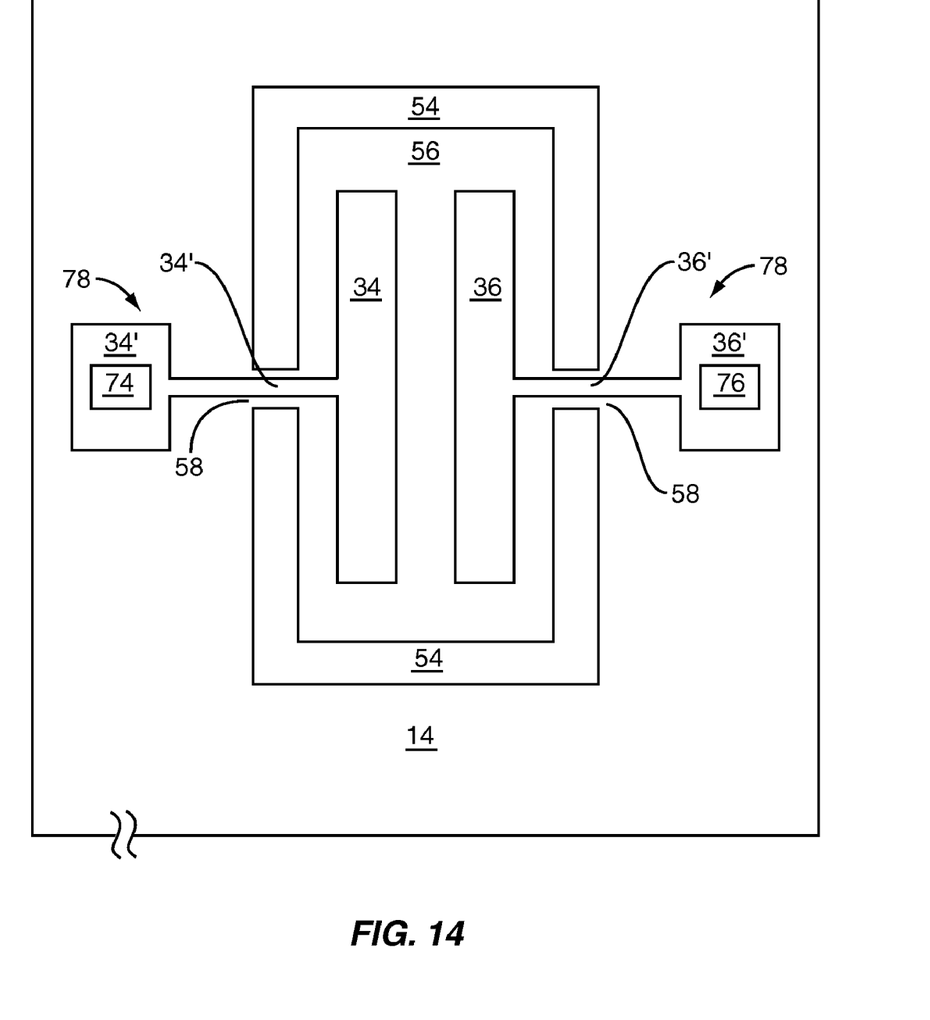
FIG. 14 depicts a top view of the MEMS resonator device suspended within a device layer as a preferred embodiment.

In FIG. 14, a top view of an integrated MEMS resonator device according to a preferred embodiment of the present invention is depicted. The input transducer 34 and the output transducer 36 are formed over the MEMS resonator body 56 as described above. Some or all of the transducer materials that form the input transducer 34 and the output transducer 36 extend over the respective anchors 58 and into a stable region 78 on the device layer 14. In this embodiment, the input contact 74 is formed over a portion of the input transducer material 34' that is in the stable region 78 on the device layer 14 and the output contact 76 is formed over a portion of the output transducer material 36' that is in the stable region 78 of the device layer 14. This configuration provides greater structural integrity by placing the input contact 74 and the output contact 76 over the device layer 14 instead of over the MEMS resonator body 56.

Those skilled in the art will recognize improvements and modifications to the preferred embodiments of the present invention. All such improvements and modifications are considered within the scope of the concepts disclosed herein and the claims that follow.

What is claimed is:

1. A structure comprising:
   a substrate having a device layer comprising a substantially freely suspended micro-electro-mechanical systems (MEMS) resonator body of a MEMS resonator device;
   a dielectric layer over the device layer and comprising a gate dielectric for a gate of a field effect transistor (FET), and further comprising a dielectric plate for at least one transducer of the MEMS resonator device, such that the dielectric layer includes both the gate dielectric and the dielectric plate; and
   a conductive layer comprising a gate electrode over the gate dielectric for the gate, and further comprising a transducer plate over the dielectric plate for the at least one transducer, such that the conductive layer includes both the gate electrode and the transducer plate,
   wherein the field effect transistor is formed on the device layer and apart from the substantially freely suspended MEMS resonator body.

2. The structure of claim 1 wherein the at least one transducer includes an input transducer and an output transducer, such that the dielectric plate and the transducer plate are for the input transducer, and the dielectric layer further comprises a dielectric plate for the output transducer, wherein the dielectric layer includes both the dielectric plate for the input transducer and the dielectric plate for the output transducer.

3. The structure of claim 2 wherein the conductive layer further comprises a transducer plate for the output transducer, such that the transducer plate for the output transducer is over the dielectric plate for the output transducer and the conductive layer includes both the transducer plate for the input transducer and the transducer plate for the output transducer.

4. The structure of claim 3 further comprising a metal layer comprising a gate contact over the gate electrode for the gate, and further comprising a metal contact plate for the input transducer and a metal contact plate for the output transducer, such that the metal contact plate for the input transducer is over the transducer plate for the input transducer and the metal contact plate for the output transducer is over the transducer plate for the output transducer, wherein the metal layer includes the gate electrode, the metal contact plate for the input transducer, and the metal contact plate for the output transducer.

5. The structure of claim 1 further comprising a metal layer comprising a gate contact over the gate electrode for the gate, and further comprising a metal contact plate over the transducer plate for the at least one transducer of the MEMS resonator device, wherein the metal layer includes both the gate electrode and the metal contact plate.

* * * * *